United States Patent
Kenington

(10) Patent No.: US 8,243,851 B2
(45) Date of Patent: Aug. 14, 2012

(54) RADIO SYSTEM AND A METHOD FOR RELAYING RADIO SIGNALS

(75) Inventor: Peter Kenington, Chepstow (GB)

(73) Assignee: Ubidyne, Inc., Wilmington, DE (US)

( * ) Notice: Subject to any disclaimer, the term of this patent is extended or adjusted under 35 U.S.C. 154(b) by 767 days.

(21) Appl. No.: 12/416,596

(22) Filed: Apr. 1, 2009

(65) Prior Publication Data

US 2010/0254441 A1    Oct. 7, 2010

(51) Int. Cl.
    *H04K 1/02* (2006.01)
(52) U.S. Cl. ........ 375/296; 375/260; 375/267; 375/295; 375/299; 375/285; 375/297
(58) Field of Classification Search ............ 375/260, 375/267, 295, 299, 296, 285
    See application file for complete search history.

(56) References Cited

U.S. PATENT DOCUMENTS

| | | | |
|---|---|---|---|
| 5,852,630 A * | 12/1998 | Langberg et al. | ............ 375/219 |
| 6,157,343 A | 12/2000 | Andersson et al. | |
| 6,510,191 B2 | 1/2003 | Bockelman | |
| 7,194,021 B2 | 3/2007 | Darbel et al. | |
| 7,580,686 B2 | 8/2009 | Fonden et al. | |
| 2002/0097085 A1 | 7/2002 | Stapleton | |
| 2002/0110211 A1 | 8/2002 | Bockelman | |
| 2003/0164961 A1 | 9/2003 | Daly | |
| 2003/0236107 A1 | 12/2003 | Azuma | |
| 2004/0204098 A1 | 10/2004 | Owen | |
| 2005/0110565 A1 * | 5/2005 | Robinson | ............ 330/124 R |
| 2005/0111575 A1 | 5/2005 | Taler et al. | |
| 2005/0282506 A1 | 12/2005 | Azuma | |
| 2008/0095266 A1 | 4/2008 | Rashev et al. | |
| 2008/0219331 A1 | 9/2008 | Liang et al. | |
| 2008/0232492 A1* | 9/2008 | Xiao et al. | ............ 375/260 |

(Continued)

FOREIGN PATENT DOCUMENTS

EP    1389837    2/2004

(Continued)

OTHER PUBLICATIONS

International Search Report & Written Opinion issued in International Patent Application No. PCT/EP2010/053713 dated Jul. 1, 2010.

(Continued)

*Primary Examiner* — Siu Lee
(74) *Attorney, Agent, or Firm* — Stephen H. Eland; Dann, Dorfman, Herrell & Skillman

(57) ABSTRACT

The present invention provides a radio system and a method for relaying radio signals. The radio system comprises at least one transmit path, a digital predistortion unit, a calibration unit and a feedback path. The feedback path is commonly used by the digital predistortion unit and the calibration unit with the present invention. The calibration signal is adapted to update at least one of phase and amplitude changes and the digital predistortion. The present invention further relates to a method for relaying radio signals. The method comprises updating the digital predistortion as well as an updating of the phase and amplitude changes. The updating of the digital predistortion and the updating of the phase and amplitude changes is implemented using a feedback signal. The present invention further relates to a computer program product for the manufacture of the radio system according to the invention. The present invention further relates to a computer program product for the execution of the method according to the present invention.

32 Claims, 14 Drawing Sheets

U.S. PATENT DOCUMENTS

| | | | |
|---|---|---|---|
| 2009/0034651 A1 | 2/2009 | Lan et al. | |
| 2009/0207940 A1* | 8/2009 | Staszewski et al. | 375/297 |
| 2010/0087227 A1* | 4/2010 | Francos et al. | 455/562.1 |
| 2010/0166098 A1* | 7/2010 | Luz et al. | 375/267 |
| 2010/0166109 A1 | 7/2010 | Neumann et al. | |
| 2010/0166110 A1 | 7/2010 | Neumann et al. | |
| 2010/0254299 A1* | 10/2010 | Kenington | 370/315 |

FOREIGN PATENT DOCUMENTS

| | | |
|---|---|---|
| EP | 1608082 | 12/2005 |
| EP | 1120858 | 4/2007 |
| EP | 1649614 | 11/2010 |
| WO | 96/15585 | 5/1996 |
| WO | 03/019773 | 3/2003 |
| WO | 2010/038227 | 4/2010 |
| WO | 2010/092076 | 8/2010 |
| WO | 2010/092082 | 8/2010 |

OTHER PUBLICATIONS

International Search Report & Written Opinion issued in International Patent Application No. PCT/EP2010/053694 dated Nov. 11, 2010.

International Search Report & Written Opinion issued in International Patent Application No. PCT/EP2010/053703 dated Nov. 11, 2010.

International Search Report & Written Opinion issued in International Patent Application No. PCT/EP2010/053707 dated Jun. 14, 2010.

International Preliminary Report on Patentability issued in PCT/EP10/53707 on Oct. 4, 2011.

International Preliminary Report issued on Oct. 4, 2011 in PCT/EP2010/053694.

International Search Report dated Jun. 14, 2010 issued in International Patent Application No. PCT/EP2010/053707.

* cited by examiner

RADIO SYSTEM AND A METHOD FOR RELAYING RADIO SIGNALS

CROSS REFERENCE TO OTHER APPLICATIONS

The present application is related to "Radio system and method for relaying radio signals with a power calibration of transmit radio signals" Ser. No. 12/416,630 filed concurrently on Apr. 1, 2009 and to "A Radio System and A Method for Relaying Radio Signals" Ser. No. 12/416,639 filed concurrently on Apr. 1, 2009 and to "A Radio System And A Method For Relaying Packetized Radio Signals" Ser. No. 12/416,626 filed concurrently on Apr. 1, 2009. The entire disclosure of each of the foregoing applications is incorporated herein by reference.

FIELD OF THE INVENTION

The field of the present invention relates to a radio system for relaying radio signals. The field of the present invention further relates to a method for relaying radio signals. Furthermore, the field of the present invention relates to a computer program product enabling a foundry to manufacture the radio system for relaying radio signals and a computer program product enabling a processor to carry out the method for relaying radio signals.

BACKGROUND OF THE INVENTION

Use of mobile communications networks has tremendously increased over the last decade. Operators of mobile communications networks have increased the number of base stations in order to meet an increased demand for service by users of mobile communications networks. The base stations typically comprise radio systems for relaying radio signals, including software and hardware components. The radio signals are typically relayed into a cell of the mobile communications network. The operators of the mobile communications network wish to reduce the costs of the base stations. It is one option to implement the radio system as an antenna embedded radio system. With the antenna embedded radio system some of the hardware components of the radio system may be implemented on a chip. The antenna embedded radio system therefore reduces the costs of the base station. Implementing the radio system as the antenna embedded radio system reduces space needed to house the hardware components of the base station. Power consumption during normal operation of the radio system is substantially reduced when implementing the antenna embedded radio system comprising the chip.

It is of interest to provide a reliable quality of service to an individual user of the mobile communications network given the increase in the number of users. Several techniques have been suggested in order to deal with the increased number of users within the mobile communications network. One of the several techniques comprises beam forming capabilities in order to direct a beam relayed by the radio system in different directions to improve service coverage within the cells of the mobile communications network. The beam forming techniques rely on defined phase and amplitude relations between several of the antenna elements of the active antenna system. Calibration of transmit paths and receive paths is required to provide the defined phase and amplitude relationship between the beams. The calibration allows the estimation of a phase and amplitude deviation accumulated along the transmit path of the radio system. Likewise the calibration comprises estimating phase and amplitude deviations accumulated along the receive paths of the radio system. The calibration may further comprise a determination of transit times needed for a message signal to travel from the digital radio interface to the antenna element in order to be relayed. In a second step the phase and amplitude deviation accumulated along the transmit paths can be corrected. An appropriate phase and amplitude change may be applied to the individual transmit paths to yield the defined phase and amplitude relationship between the individual transmit paths of the radio system, in order to allow for beam forming techniques.

Applying the phase and amplitude changes to the transmit paths of the radio system strongly relies on transfer characteristics of the radio system being linear. Typically, an amplifier used within the transmit paths causes non-linearities within the transfer characteristics of the transmit paths. Analogue predistortion or digital predistortion are known methods for correcting the non-linearities of the transmit paths. It is of interest to provide the digital predistortion prior to the applying of the phase and amplitude changes. With significant non-linearities in the transfer characteristics of the transfer paths, the phase and amplitude changes will not yield the defined relative phase and amplitude relationship needed for the beam forming techniques.

The calibration of the phase and amplitude changes and the digital predistortion require a feedback path. The feedback path is in both cases used in order to evaluate any changes a radio signal undergoes when being relayed along the transmit paths. This holds for both a calibration signal as well as the payload signal being relayed by the radio system.

The prior art discloses two distinct feedback paths for calibrating the phase and amplitude changes and the digital predistortion. This requires time and it would be advantageous to calibrate the radio system faster and more efficiently. The two distinct feedback paths require additional complexity within the system and it is desirable to reduce this as far as possible.

SUMMARY OF THE INVENTION

A radio system for relaying radio signals according to the present invention comprises: at least one transmit path, a digital predistortion unit, a calibration unit and a feedback path. The at least one transmit path is adapted to forward a payload signal as a transmit signal. The digital predistortion unit is adapted to apply a digital predistortion to the payload signal for linearising a transfer characteristic of the radio system. The calibration unit is adapted to apply phase and amplitude changes to the at least one transmit path. The feedback path is used for feeding back a feedback signal. The feedback path is commonly used by the digital predistortion unit and the calibration unit. The feedback signal is adapted to update at least one of the phase and amplitude changes and the digital predistortion. It is to be understood that the feedback signal provided with the present invention can be used concurrently to update the phase and amplitude changes and the digital predistortion with the radio system of the invention.

It is to be understood that the radio system is described with respect to non-packetized signals internal to the radio system. A radio system dealing with packetized radio signals is disclosed in a co-pending application of the application Ser. No. 12/416,626.

It is to be understood that the radio system does not require a calibration signal generator for generating a calibration signal. Neither the phase and amplitude changes nor an updating of the digital predistortion require the calibration signal.

It is to be understood that at least one of the phase and amplitude changes and the digital predistortions is adaptable using correlations, i.e. correlation techniques of the payload signal and the feedback signal for the radio system. The correlations of the payload signal and the feedback signal are carried out with the feedback signal and the payload signal within substantially the same frequency range. Typically the correlations will be carried out in the base band of the radio system. Without any limitations the correlations may be carried out at any other intermediate frequency between the base band of the radio system and the band of transmission of the radio system.

The term "relaying" as used herein shall be construed as comprising a transmitting as well as a receiving of radio signals. The receiving of the radio signals is commonly referred to as Rx. The transmitting of the radio signals is commonly referred to as Tx.

The radio system as described herein enables the reduction of hardware components needed for updating the digital predistortions and for the calibrating of the phase and amplitude changes as the calibration signal generator is not required. The speed of the calibration is also substantially increased.

According to a further aspect the present invention relates to a method for relaying radio signals. The method comprises providing a payload signal and applying a digital predistortion to the payload signal. The method further comprises applying phase and amplitude changes to at least one of the transmit paths. The method further comprises forwarding the payload signal as a transmit signal along at least one transmit path. According to the method a selected one of coupled transmit signals is fed back as a feedback signal. The method further comprises updating the digital predistortion in response to the feedback signal. Furthermore the method comprises updating the phase and amplitude changes in response to the feedback signal.

The updating of the digital predistortion and the calibration may be carried out concurrently.

The present invention further provides a computer program product for a manufacture of the radio system according to the invention.

In yet another aspect the present invention provides a computer program product for carrying out the method according to the invention.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will also be understood that features of one aspect can be combined with a feature of a different aspect.

Figure 1:
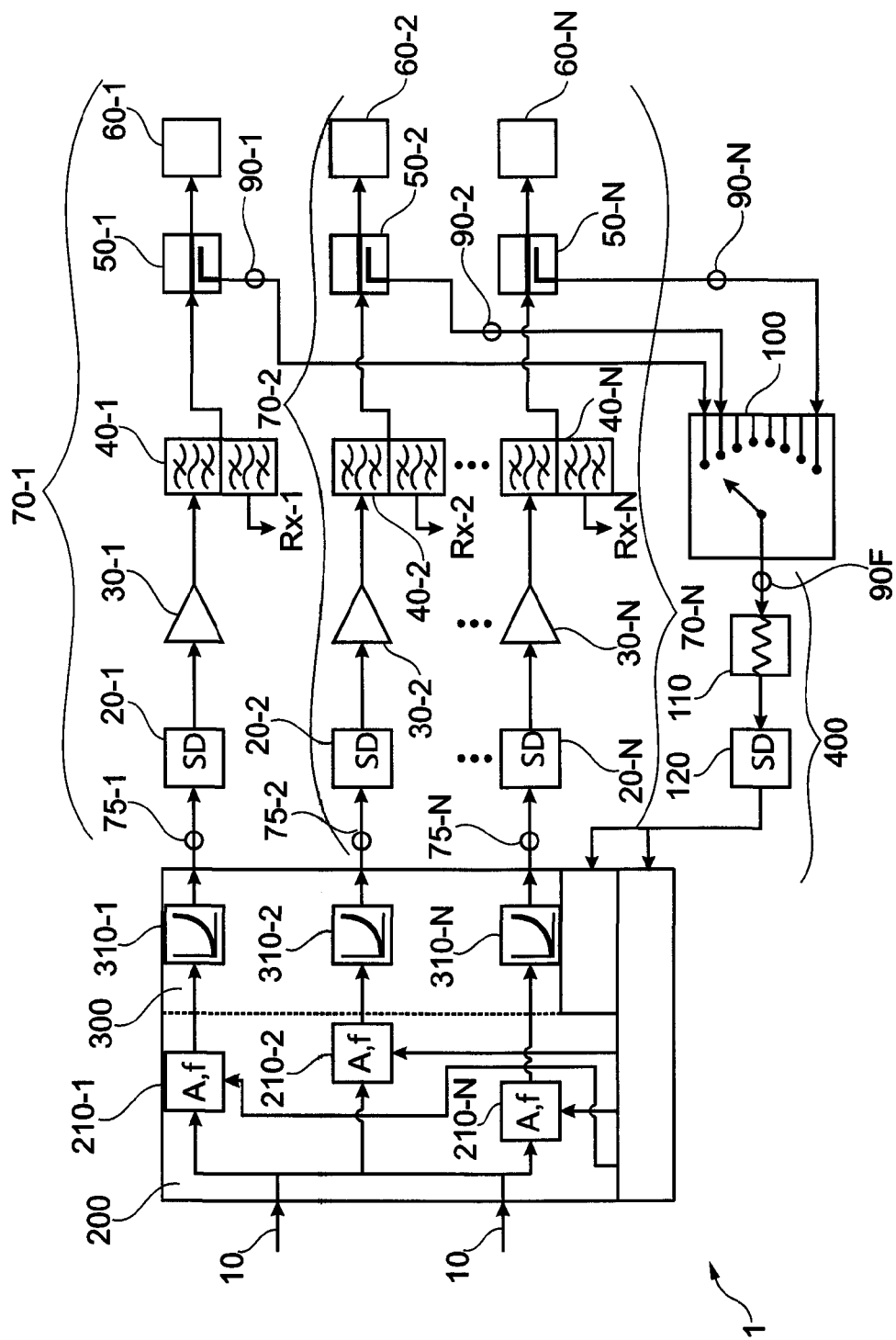
FIG. 1 shows a radio system according to the present invention.

FIG. 1 shows a radio system 1. A payload signal 10 is forwarded to the radio system 1. Typically the payload signal 10 is provided in a format comprising an in phase component I and a quadrature component Q. The payload signal 10 is forwarded to a digital radio interface (DRI) as is known in the art. The digital radio interface may be implemented in one non-limiting aspect of the invention according to the open base station architecture initiative standard (OBSAI). A calibration unit 200 is adapted to apply amplitude and phase changes 210-1, 210-2, . . . , 210-N to the payload signal 10. A digital predistortion unit 300 is provided in the radio system 1. The digital predistortion unit 300 is adapted to apply a digital predistortion 310-1, 310-2, . . . , 310-N to the payload signal 10. The digital predistortion 310-1, 310-2, . . . , 310-N may also be referred to as DPD in short. The radio system 1 comprises at least one transmit path 70-1, 70-2, . . . , 70-N. Only three of the transmit paths 70-1, 70-2, . . . , 70-N are shown in FIG. 1. Obviously any other number of transmit paths 70-1, 70-2, . . . , 70-N is conceivable. Typically, the transmit paths 70-1, 70-2, . . . , 70-N are terminated by an antenna element 60-1, 60-2, . . . , 60-N. The transmit paths 70-1, 70-2, . . . , 70-N are adapted to relay the payload signal 10 as a transmit signal 75-1, 75-2, . . . , 75-N along the transmit paths 70-1, 70-2, . . . , 70-N. The antenna elements 60-1, 60-2, . . . , 60-N may be transmit-only antenna elements Alternatively or additionally, the antenna elements 60-1, 60-2, . . . , 60-N may be transmit and receive antenna elements. Only the transmit path 70-1, 70-2, . . . , 70-N are shown in this aspect of the invention. The radio system 1 may be combined with a receive system known in the art. The receive system is not shown but will comprise receive paths Rx-1, Rx-2, . . . , Rx-N.

The transmit signals 75-1, 75-2, . . . , 75-N are digital to analogue converted using a digital to analogue converter 20-1, 20-2, . . . , 20-N along the transmit paths 70-1, 70-2, . . . , 70-N. The digital to analogue converter 20-1, 20-2, . . . , 20-N may comprise a sigma delta digital to analogue converter, as shown in FIG. 1. The sigma delta digital to analogue converters 20-1, 20-2, . . . , 20-N do not require an up-converter 25-1, 25-2, . . . , 25-N (see FIG. 5) for up-converting and filtering the transmit signal 75-1, 75-2, . . . , 75-N. An amplifier 30-1, 30-2, . . . , 30-N is provided for amplifying the transmit signal 75-1, 75-2, . . . , 75-N. A filter 40-1, 40-2, . . . , 40-N is provided for separating the transmit paths 70-1, 70-2, . . . , 70-N from the receive paths Rx-1, Rx-2, . . . , Rx-N. The filter 40-1, 40-2, . . . , 40-N may be implemented as a duplex filter as shown in FIGS. 1-8. The filters 40-1, 40-2, . . . , 40-N are adapted to eliminate any signal components that are out of a frequency band of transmission of the radio system 1.

In order to allow for a calibration of the radio system 1, a portion of the transmit signals 75-1, 75-2, . . . , 75-N is fed back to the calibration unit 200. The present invention provides a coupler 50-1, 50-2, . . . , 50-N to extract the portion of the transmit signal 75-1, 75-2 . . . , 75-N as a coupled transmit signal 90-1, 90-2, . . . , 90-N. The feedback of the coupled transmit signals 90-1, 90-2, . . . , 90-N allows for determining phase and amplitude deviations accumulated between individual ones of the transmit signals 75-1, 75-2, . . . , 75-N travelling along the transmit paths 70-1, 70-2, . . . , 70-N. The feedback of the coupled transmit signals 90-1, 90-2, . . . , 90-N also allows for an updating of the digital predistortion 310-1, 310-2, . . . , 310-N applied to the payload signal 10.

In the prior art two different feedback paths have been used for the feedback of the coupled transmit signals 90-1, 90-2, . . . , 90-N. A first feedback path for feedback to the calibration unit 200 and a second feedback path for feedback to the digital predistortion unit 300. The present invention provides a feedback path 400 that can be used for both a calibration of the amplitude and phase changes 210-1, 210-2, . . . , 210-N as well as for an updating of the digital predistortions 310-1, 310-2, . . . , 310-N. A calibration update unit 240 uses the feedback path 400, more precisely signals relayed along the feedback path 400, in order to update the phase and amplitude changes 210-1, 210-2, . . . , 210-N applied to the payload signal 10. A digital predistortion update module 340 uses the feedback path 400, more precisely signals relayed along the feedback path 400, in order to calibrate the digital predistortions 310-1, 310-2, . . . , 310-N that are to be applied to the payload signal 10.

The coupler 50-1, 50-2, . . . , 50-N is adapted to extract the coupled transmit signal 90-1, 90-2, . . . , 90-N from the transmit path 70-1, 70-2, . . . , 70-N. A switch 100 is adapted to forward a selected one of the coupled transmit signals 90-1, 90-2, . . . , 90-N into the feedback path 400. The feedback path 400 comprises an attenuator 110. Furthermore the feedback path 400 comprises an analogue to the digital convertor 120. The analogue to digital convertor 120 is in the form of a sigma delta analogue to digital converter.

It is to be understood that the radio system 1 does not require a calibration signal generator as is used with the prior art. The radio system 1 uses the payload signal 10 for calibrating the phase and amplitude changes 210-1, 210-2, . . . , 210-N as well as for updating the digital predistortions 310-1, 310-2, . . . , 310-N.

FIG. 1 shows a switch 100 for selecting a selected one of the coupled transmit signals 90-1, 90-2, . . . , 90-N as a feedback signal 90F. The feedback signal 90F travels along the feedback path 400. It will be appreciated by a person skilled in the art that the switch 100 may be replaced by a combiner (not shown). The use of the combiner may entail incorporating switches and/or attenuators (not shown) in order to suppress at least one selected one of the coupled transmit signals 90-1, 90-2, . . . , 90-N.

A position of the switch 100 is controlled by the calibration unit 200 and the digital predistortion unit 300. In other words the calibration unit 200 and the digital predistortion unit 300 know which one of the coupled transmit signals 90-1, 90-2, . . . , 90-N is to be forwarded to the calibration update module 240 and the predistortion update module 340 along the feedback path 400.

Figure 2:
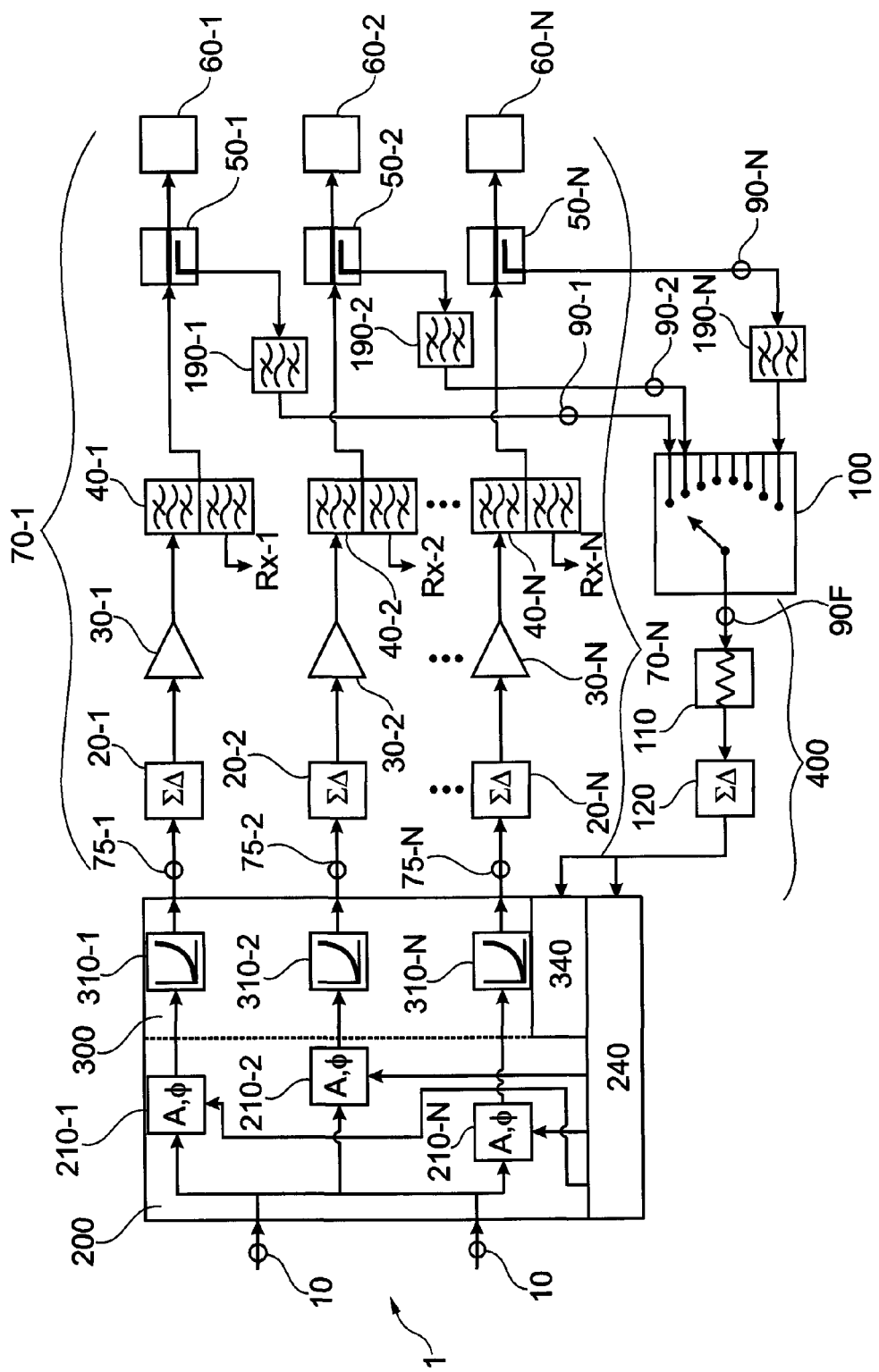
FIG. 2 shows another aspect of the radio system according to the present invention.

FIG. 2 shows a further aspect of the radio system 1. Additionally to the features already described with respect to FIG. 1, there are filters 190-1, 190-2, . . . , 190-N provided in the further aspect depicted in FIG. 2. The filters 190-1, 190-2, . . . , 190-N may be of interest when the couplers 50-1, 50-2, . . . , 50-N are placed close to the antenna elements 60-1, 60-2, . . . , 60-N. The filters 190-1, 190-2, . . . , 190-N may help to suppress any signal components interfering with the transmit signals 75-1, 75-2, . . . , 75-N. It is conceivable that the couplers 50-1, 50-2, . . . , 50-N are also coupling to a signal that does not stem from their respective antenna element 60-1, 60-2, . . . , 60-N, but from an adjacent one of the antenna elements 60-1, 60-2, . . . , 60-N. Furthermore it is possible for the coupler 50-1, 50-2, . . . , 50-N to couple to the radio signals received by the antenna elements 60-1, 60-2, . . . , 60-N. The received radio signals are not of interest when calibrating the transmit path 70-1, 70-2, . . . , 70-N or when updating the digital predistortions 310-1, 310-2, . . . , 310-N of the radio system 1. Therefore it may be of advantage to provide the filters 190-1, 190-2, . . . , 190-N.

Figure 3:
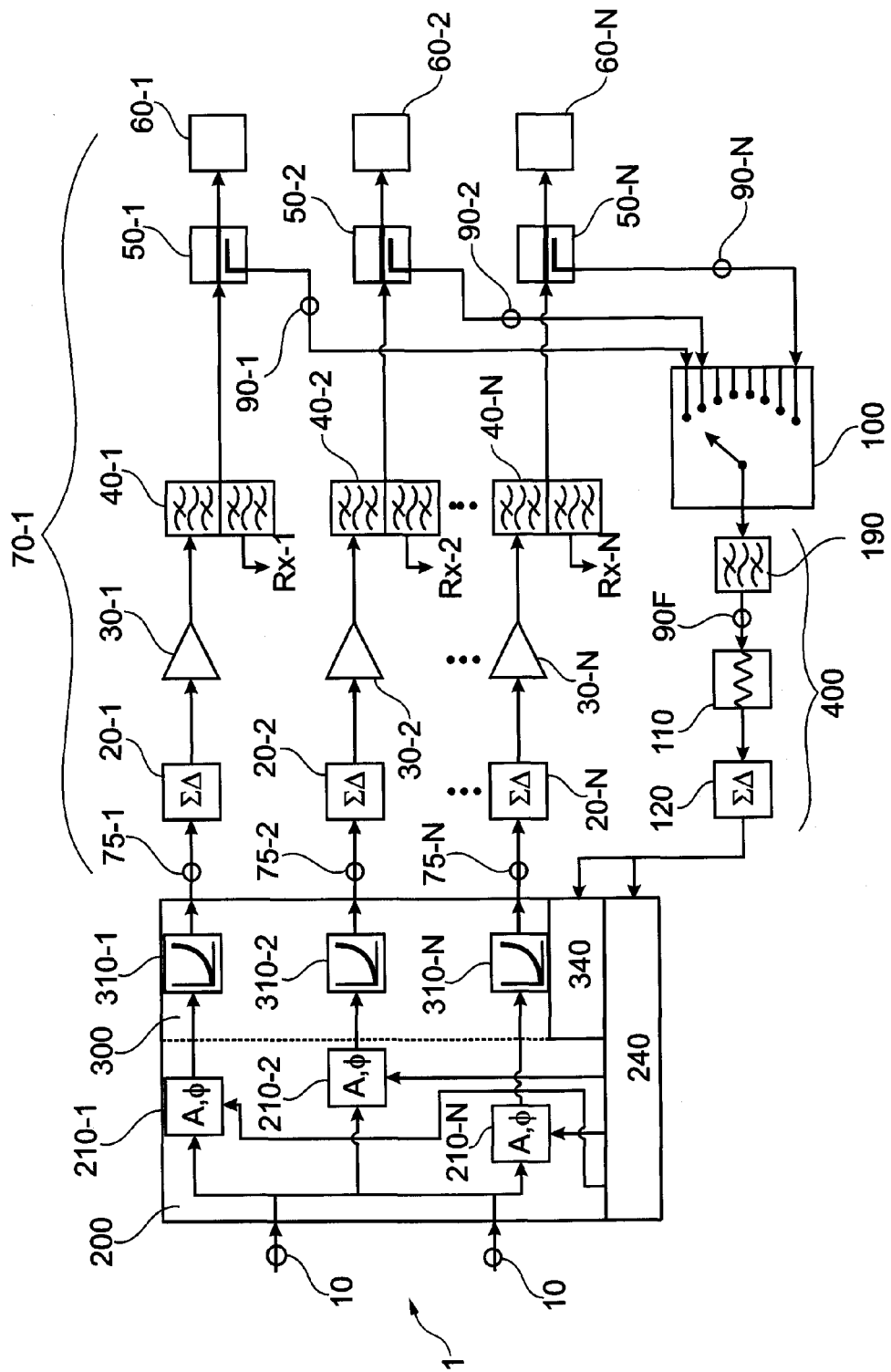
FIG. 3 shows yet another aspect of the radio system according to the present invention.

FIG. 3 shows a further aspect of the radio system 1. Elements of the radio system 1 as already discussed are given like reference numerals. The filters 190-1, 190-2, . . . , 190-N are moved downstream of the switch 100 in the aspect shown in FIG. 3. Such an arrangement may be of interest to reduce the number of the filters 190-1, 190-2, . . . , 190-N used. At the same time it may be necessary for the filter 190 in FIG. 3 to incorporate all filtering characteristics of the filters 190-1, 190-2, . . . , 190-N as shown in FIG. 2.

Figure 4:
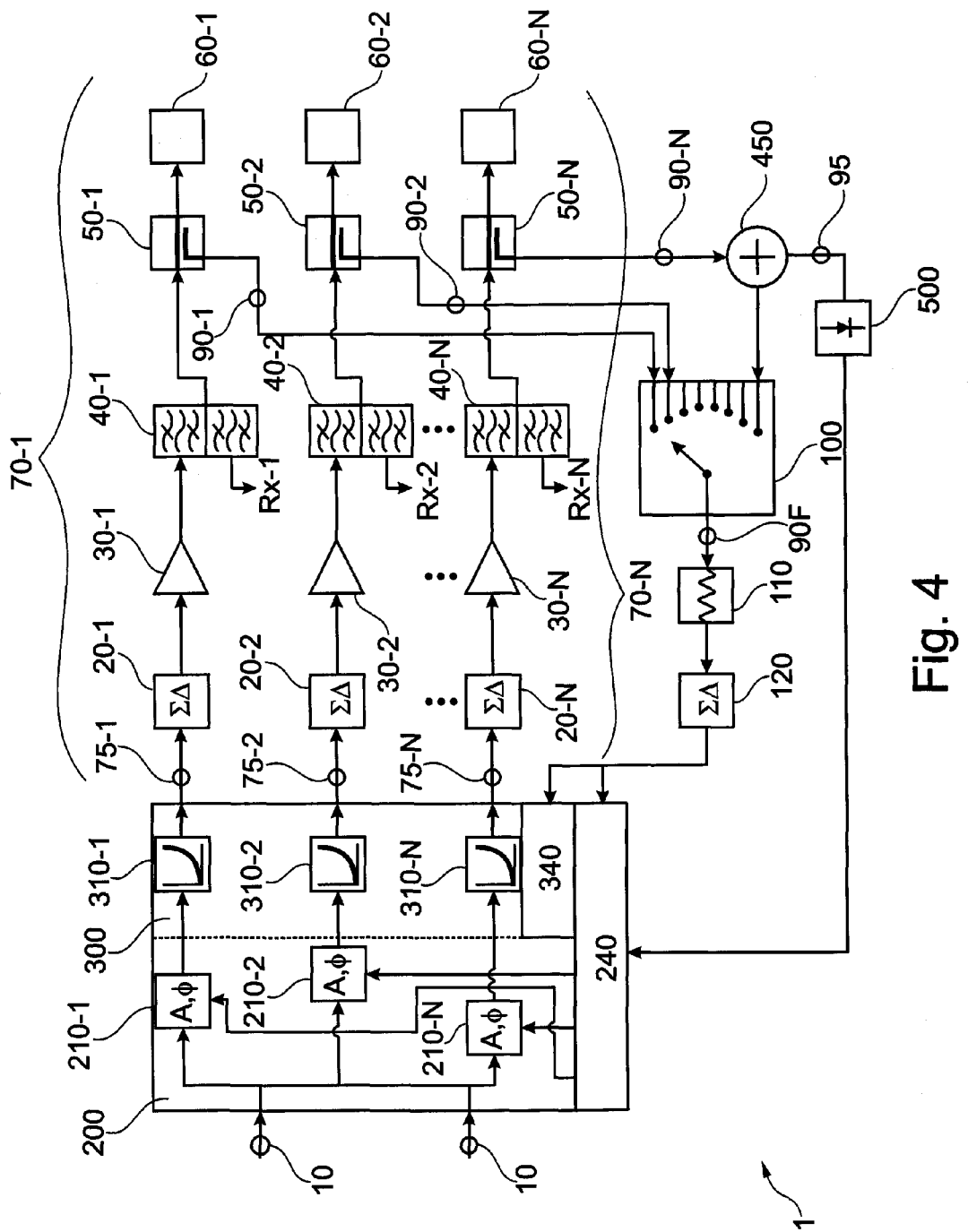
FIG. 4 shows the radio system according to the present invention incorporating a power detector.

FIG. 4 shows yet another aspect of the radio system 1. The radio system 1 of FIG. 4 additionally incorporates a splitter 450. The splitter 450 is placed downstream of one of the couplers 50-1, 50-2, . . . , 50-N. Only one of the splitters 450 is shown in FIG. 4. Without any limitation it is possible to provide more than one of the splitters 450. It will be appreciated by a person skilled in the art that provision of more than one of the splitter 450 and the power sensor 500 may be provided The splitter 450 forwards a portion of a selected coupled transmit signal 90-1, 90-2, . . . , 90-N to a power detector 500. The power detector 500 may be implemented as a diode or any other suitable RF power detector. The power detector 500 allows the measurement and/or updating of a transmit power level relayed by the transmit path 70-1, 70-2, . . . , 70-N pertaining to the selected coupled transmit signal 90-1, 90-2, . . . , 90-N. It will be appreciated by a person skilled in the art that provision of more than one of the splitter 450 and the power sensor 500 will provide a redundancy of the power monitoring and transmit power level updating.

Precisely the power detector 500 allows the measurement of a transmit power level of the portion 95. It is possible to deduce the power level of the transmit path 70-1, . . . , 70-N pertaining to the portion 95. Attenuating properties and/or gain changing properties of the transmit path 70-1, 70-2, . . . , 70-N pertaining to the portion 95, the coupler 50-1, 50-2, . . . , 50-N and the splitter 450 need to be substantially known when deducing the power level of this transmit path 70-1, 70-2, . . . , 70-N. In FIG. 4 the portion 95 pertains to the transmit path 70-N.

A signal of known transmit power level would allow the measurement of the different gain changing and attenuating properties for the transmit path 70-1, . . . , 70-N pertaining to the portion 95, the couplers 50-1, 50-2, . . . , 50-N and the splitter 450 Such a signal could, for example, be provided during the manufacture of the radio system 1, specifically to allow the calibration of the power level of the transmit path 70-1, 70-2, . . . , 70-N pertaining to the portion 95 to take place.

It is to be understood that the power detector 500 also allows the monitoring and measuring of the transmit power levels of the transmit paths 70-1, 70-2, . . . 70-N not pertaining to the portion 95. More precisely the power detector 500 allows a measuring of a relative transmit power level ratio between the transmit paths 70-1, 70-2 . . . 70-N.

When measuring the relative transmit power level ratio of the transmit paths 70-1, 70-2, . . . 70-N the calibration unit 200 and/or the calibration update module 240 may use a transmit power level deduced from the feedback signal 90F and/or the base band feedback signal 90B after the analogue to digital converter 120. Gain and attenuating properties of the transmit paths 70-1, . . . , 70-N, the couplers 50-1, 50-2, . . . , 50-N, the switch 100, the splitter 450, the attenuator 110 and the analogue to digital converter 120 need to be substantially known for determining transmit power levels based on the feedback signal 90F and/or the base band feedback signal 90B.

Figure 5:
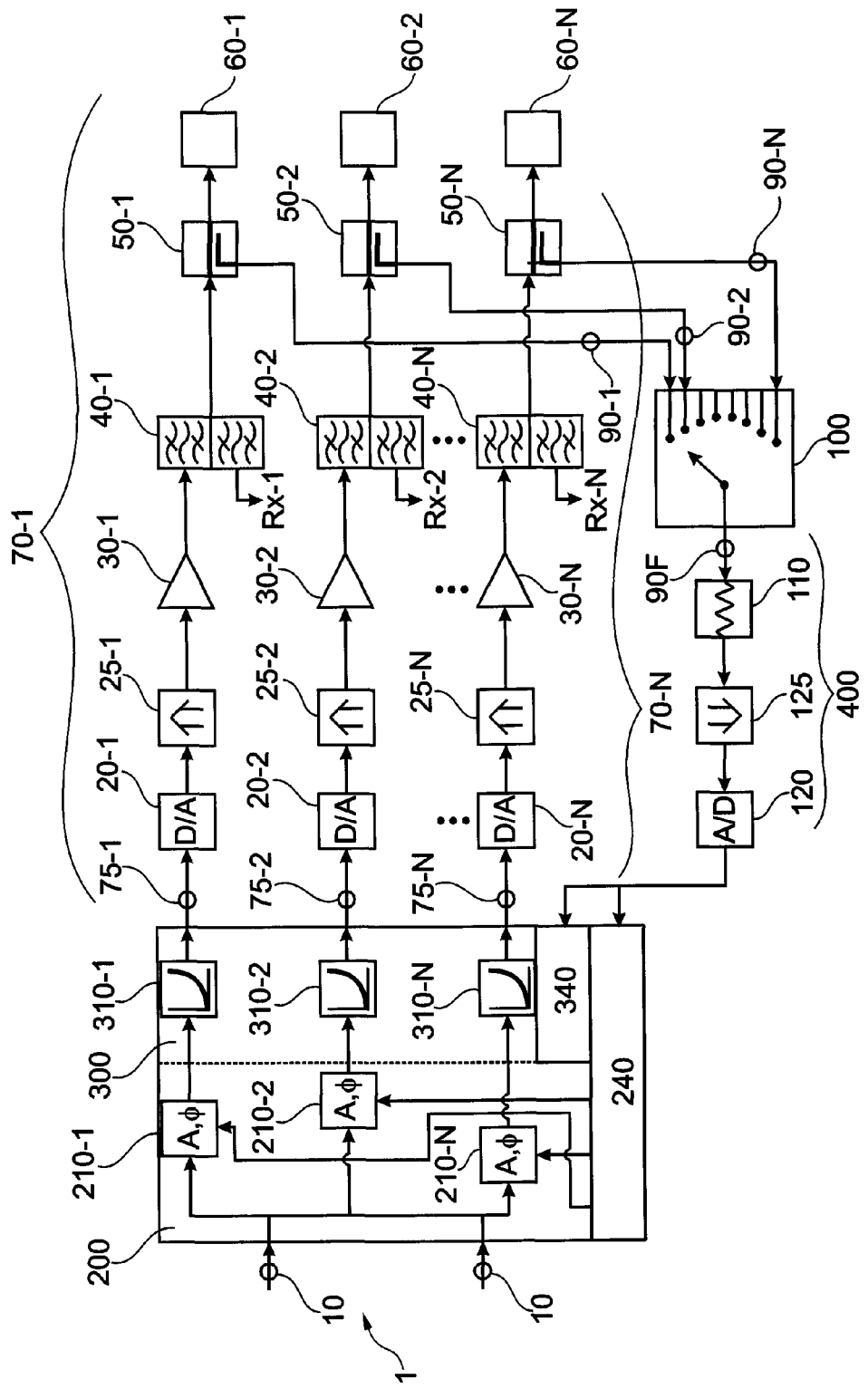
FIG. 5 shows the radio system according to the present invention incorporating conventional analogue to digital converters and conventional digital to analogue converters.

FIG. 5 shows the radio system 1 in yet another aspect. The aspects shown in FIGS. 1-4 show the digital to analogue converters 20-1, 20-2, . . . , 20-N and the analogue to digital converter 120 implemented as sigma delta converters. Without any limitation it is possible to use conventional digital to analogue converters 20-1, 20-2, . . . , 20-N and conventional down-converters 120, as shown in FIG. 5. The conventional digital to analogue converters 20-1, 20-2, . . . , 20-N require an up-converter 25-1, 25-2, . . . , 25-N. The up-converter 25-1, 25-2, . . . , 25-N may further comprise a filtering capability. Likewise the conventional analogue to digital converter 120 requires a down-converter 125. The down-converter 125 may additionally well comprise a filtering capability. The difference in design depicted in FIG. 5 with respect to FIGS. 1-4 reflects the characteristic feature of the sigma delta converters as is known in the art. The sigma delta converters do not require up-converters 25-1, 25-2, . . . , 25-N nor down-converters 125, respectively.

Figure 6:
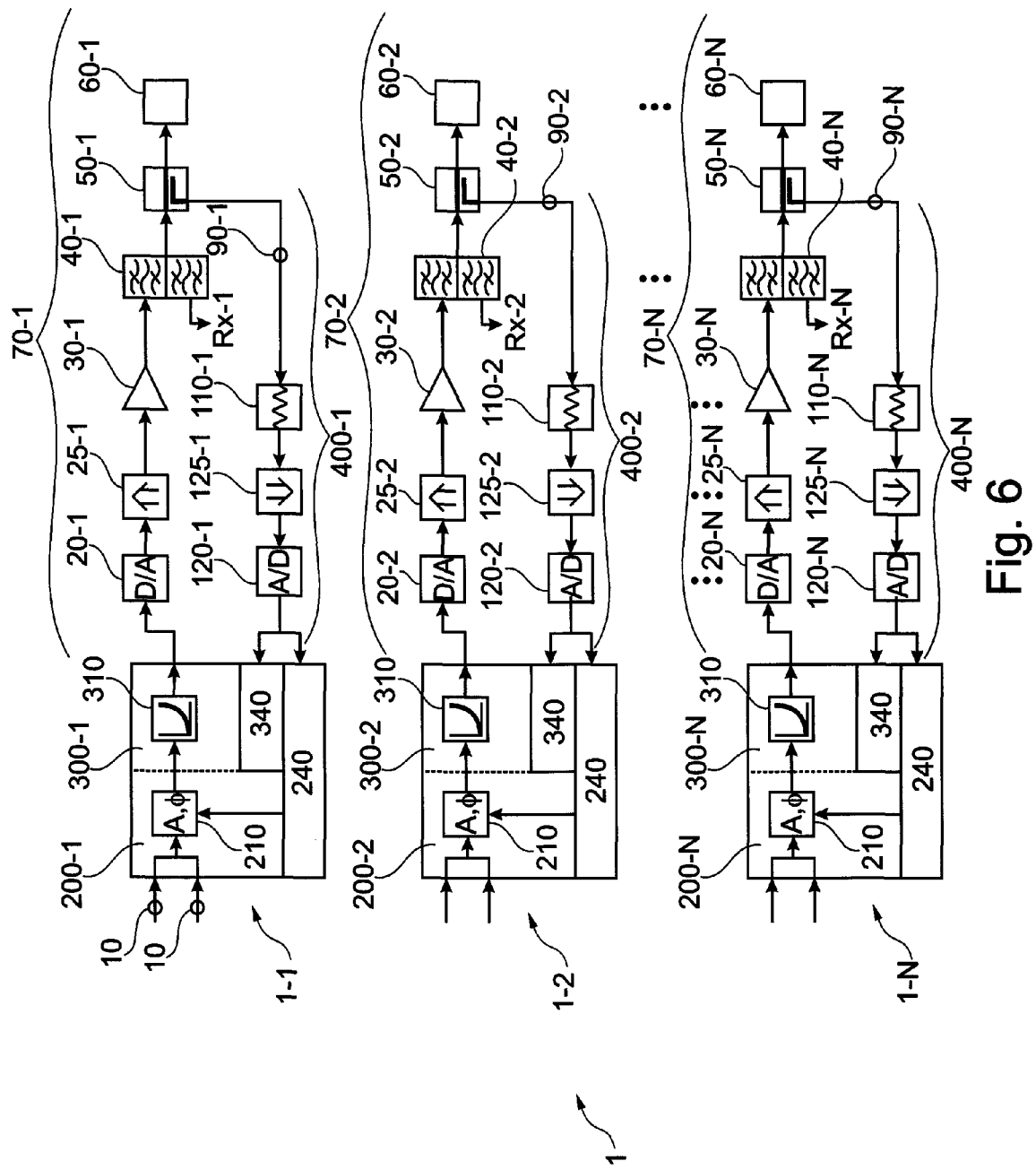
FIG. 6 shows a further aspect of the radio system providing a feedback path for each transmit path.

FIG. 6 shows a further aspect of the radio system 1 according to the present invention. Generally it is more expensive to provide several ones of the feedback paths 400-1, 400-2, 400-N when manufacturing the radio system 1. In FIG. 6 there are shown N instances 1-1, 1-2, . . . , 1-N of the radio system 1 as described with respect to FIGS. 1-5. Each one of the N instances of the radio system 1 in FIG. 6 has a single transmit path 70-1, 70-2, . . . , 70-N and an individual one of the feedback paths 400-1, 400-2, . . . , 400-N.

Providing the instances of the radio system 1 is more efficient when implementing the radio system 1 with a high level of integration. The high level of integration may be present for indoor systems. It may be cheaper and simpler to replicate the complete transmit paths 70-1, 70-2, 70-N and the feedback paths 400-1, 400-2, . . . , 400-N, i.e. the complete N instances 1-1, 1-2, . . . , 1-N of the radio system 1 with the high level of integration present. Obviously, with the aspect as shown in FIG. 6, there is no need for the switch 100 to be provided.

For all aspects of the radio station 1 as discussed so far it was assumed that the filter 40-1, 40-2, . . . , 40-N comprises a filtering characteristics spectrally wide enough in the transmit direction to allow through all sideband intermodulation distortion information required for the updating of the digital predistortions 310-1, 310-2, . . . , 310-N to work reliably. In many cases it may not be true that the filtering characteristics of the filters 40-1, 40-2, . . . , 40-N are spectrally wide enough in this respect.

Figure 8:
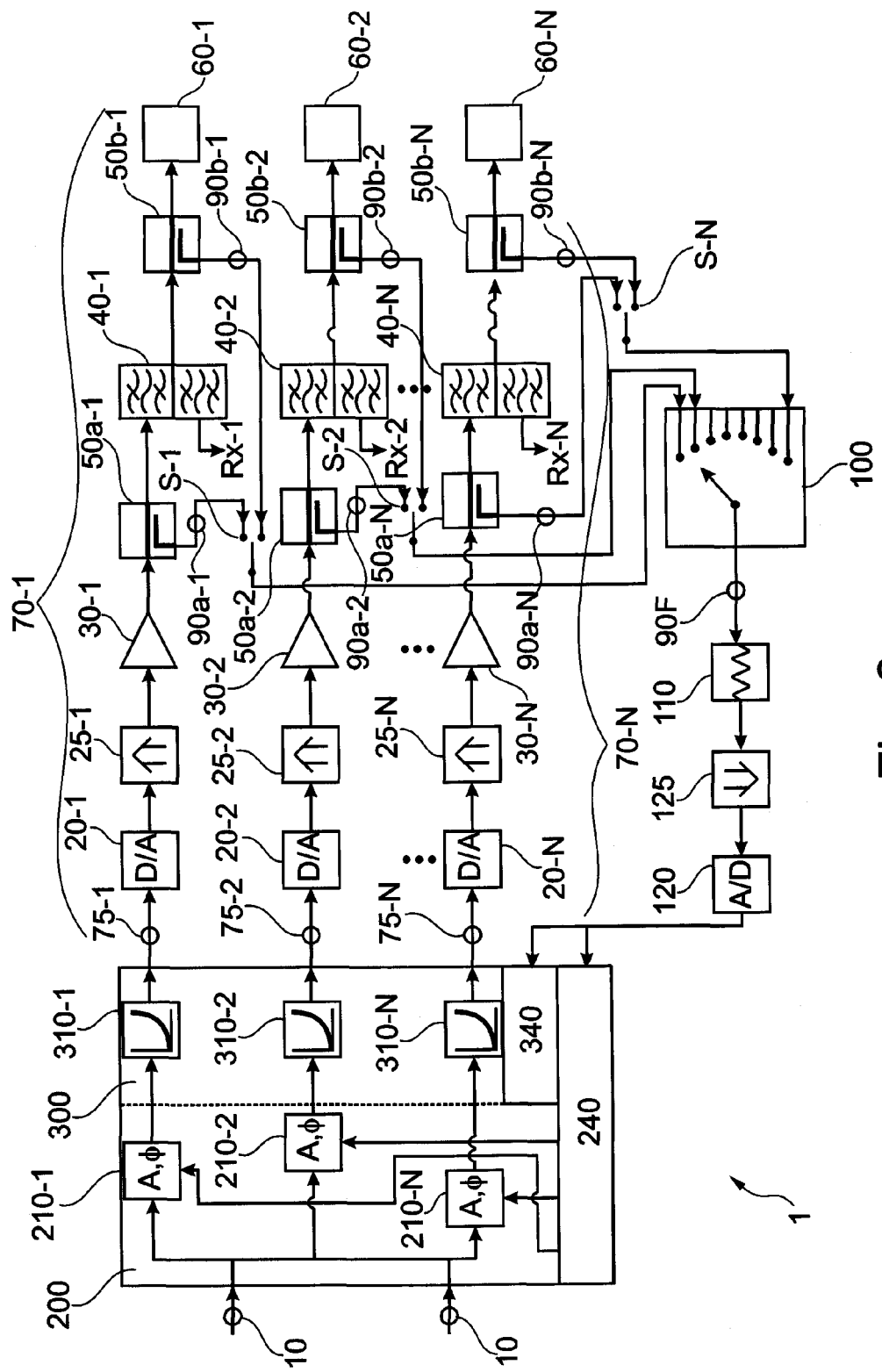
FIG. 8 shows a variant of the radio system comprising two sets of couplers.

FIG. 8 shows an aspect of the radio system 1 which may be of interest when implemented filtering characteristics of the filters 40-1, 40-2, . . . , 40-N are spectrally not wide enough as described above. The aspect shown in FIG. 8 comprises a first set of couplers 50a-1, 50a-2, . . . , 50a-N arranged before the filters 40-1, 40-2, . . . , 40-N in a transmit direction. The first set of couplers 50a-1, 50a-2, . . . , 50a-N allows for extracting a first group of coupled transmit signals 90a-1, 90a-2, . . . , 90a-N. The first group of coupled transmit signals 90a-1, 90a-2, . . . , 90a-N reflects the output of the amplifiers 30-1, 30-2, . . . , 30-N. A second group of transmit signals 90b-1, 90b-2, . . . , 90b-N reflects the transmit signals 75-1, 75-2, . . . , 75-N relayed by the antenna elements 60-1, 60-2, . . . , 60-N. The switch 100 (as shown in FIGS. 1-6) has been replaced with a switch 101 comprising one output and 2N input terminals. Therefore for each one of the transmit paths 70-1, 70-2, . . . , 70-N it is possible to forward either a selected one of the first group of coupled transmit signals 90a-1, 90a-2, . . . , 90a-N or a selected one of the second group of coupled transmit signals 90b-1, 90b-2, . . . , 90b-N. The first group of coupled transmit signals 90a-1, 90a-2, . . . , 90a-N is used for the updating of the digital predistortions 310-1, 310-2, . . . , 310-N. The second group of coupled transmit signals 90b-1, 90b-2, . . . , 90b-N are used for calibrating the phase and amplitude changes 210-1, 210-2, . . . , 210-N.

Figure 7:
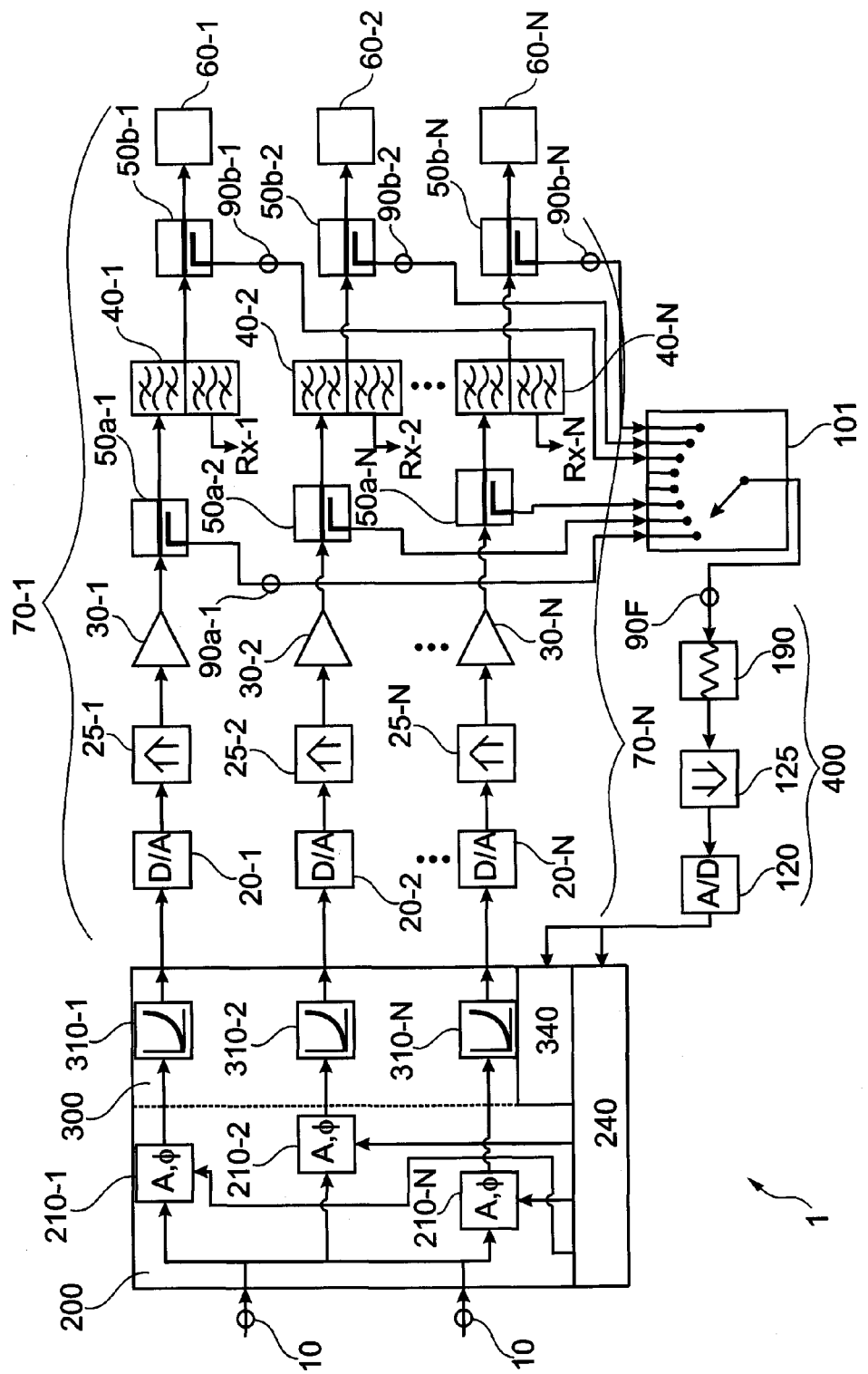
FIG. 7 shows an aspect of the radio system comprising two sets of couplers.

FIG. 8 shows a variant of the aspect of the radio system 1 described with respect to FIG. 7. In FIG. 8 switches S-1, S-2, . . . , S-N are disposed for each one of the transmit paths 70-1, 70-2 . . . , 70-N. The switches S-1, S-2, . . . , S-N allow switching between the first group of coupled transmit signals 90a-1, 90a-2, . . . , 90a-N and the second group of coupled transmit signals 90b-1, 90b-2, . . . , 90b-N for each one of the transmit paths 70-1, 70-2, . . . , 70-N, individually. It is to be understood that the switch 100 comprising N entry ports is sufficient for the radio station 1 as shown in FIG. 8. Typically the switches S-1, S-2, . . . , S-N are located very close to the antenna elements 70-1, 70-2, . . . , 70-N and therefore may well be some distance from the calibration unit 200, the digital predistortion unit 300, the calibration update unit 240 and the digital predistortion update unit 340. Providing the switches S-1, S-2, . . . , S-N may hence halve a length of lines from the first and second group of couplers 50a-1, 50a-2, . . . , 50a-N, 50b-1, 50b-2, . . . , 50b-N to the switch 100, 101 and hence the feedback path 400. The radio system 1 requiring only half the length of the lines will therefore be cheaper to manufacture. The lines may as a non-limiting example comprise coax cable, fibre links, micro strips and the like.

Figure 9:
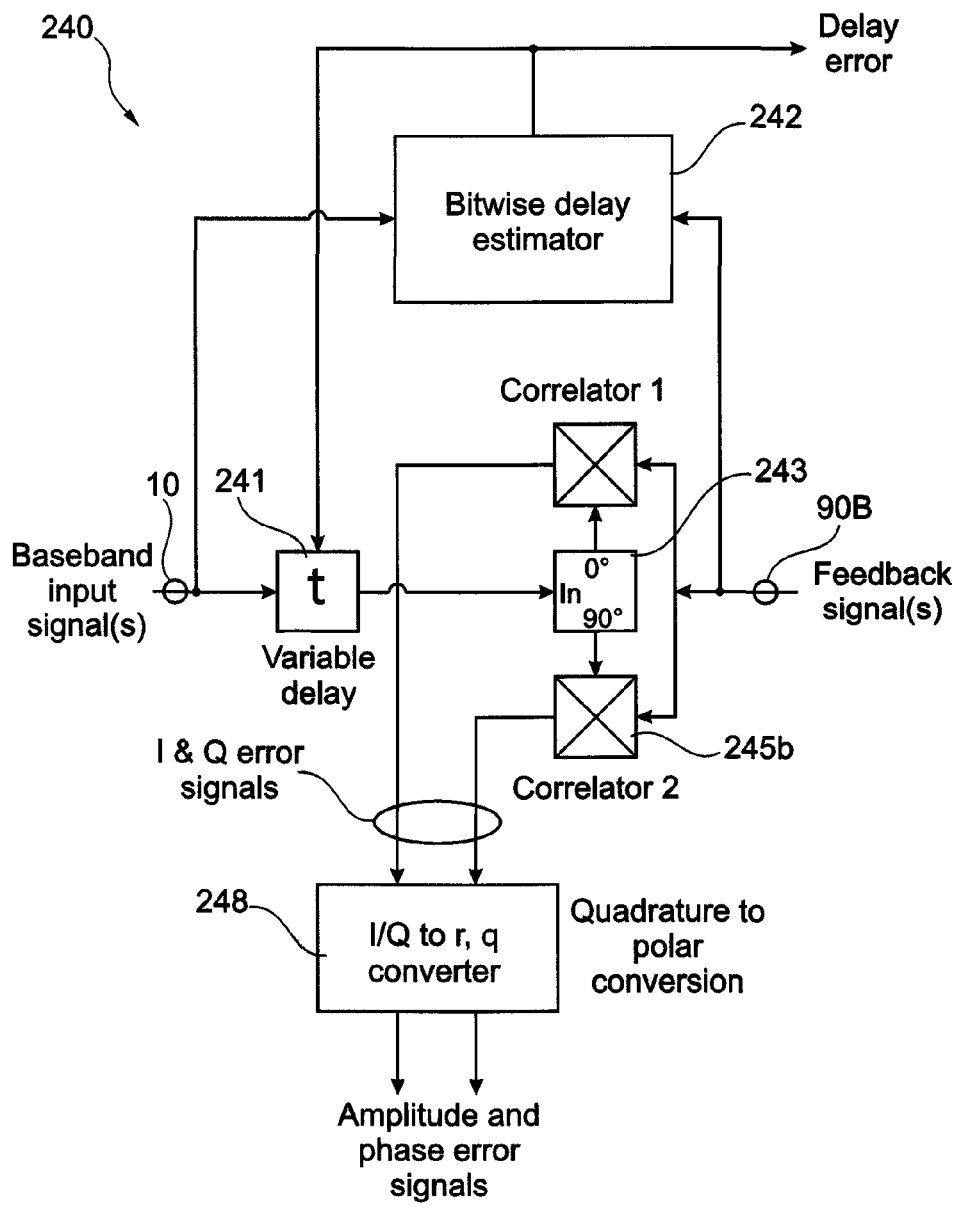
FIG. 9 shows a detailed view of a calibration update module according to the present invention.

FIG. 9 shows the calibration update unit 240 in more detail. The payload signal 10 is provided to the calibration update unit 240 and a variable delay 241 is added to the payload signal 10. The variable delay 241 may, for example, compensate the time required for the payload signal 10 to travel along the transmit path 70-1, 70-2, . . . , 70-N and the length of the feedback path 400. The (delayed) payload signal 10 is forwarded to a splitter 243 splitting the (delayed) payload signal 10 into the in-phase component I and the quadrature component Q. The in-phase component I of the (delayed) payload signal 10 is forwarded to a first correlator 245a. The quadrature component Q of the (delayed) payload signal 10 is forwarded to a second correlator 245b. The first and the second correlator 245a and 245b are adapted to deduce transmit deviations 90T between the transmit signals 90-1, 90-2, 90-N and the (delayed) payload signal 10. More precisely, the first correlator 245a and the second correlator 245b correlate the in-phase component I and the quadrature component Q of the (delayed) payload signal 10 with the base band feedback signal 90B that was injected into the payload 10 as can be seen in FIGS. 1-6.

The calibration update unit 240 further comprises a delay estimator 242. The delay estimator 242 is adapted to estimate a delay between the payload signal 10 and the transmit signals 75-1, 75-2, . . . , 75-N being relayed by the radio system 1. The delay estimated by the delay estimator 242 provides a measure for a transmit time needed for the payload 10 reaching the digital radio interface until a corresponding transmit signal 75-1, ..., 75-N is being relayed by the antenna elements 60-1, 60-2, ..., 60-N. The delay estimator 242 is further used in order to give a first estimate of the variable time delay 241 that needs to be added to the payload signal 10 before correlating the in phase component I and the quadrature component Q of the (delayed) payload signal 10 with the feedback signal 90F. Most conveniently the correlation is carried out using the base band calibration signal 90B downstream of the digital to analogue converter 120 (see FIGS. 1-8). Again it would be possible as well to carry out the correlating at the intermediate frequency. Using the intermediate frequency would require both the feedback signal and the payload signal 10 to be provided at the intermediate frequency or to be suitably upconverted or downconverted to the intermediate frequency, as required.

The calibration update unit 240 further comprises a converter module 248. The converter module 248 converts the transmit deviation 90T provided in an in phase I and quadrature component Q format into the transmit deviations 90T in a polar format comprising a phase deviation and an amplitude deviation. The transmit deviations 90T represented in the polar format provide the phase and the amplitude deviation that is accumulated along the transmit paths 70-1, 70-2, ..., 70-N and the feedback path 400 of the radio system 1.

It is to be noted that the transmit deviations 90T may need to be corrected for a portion of the transmit deviations 90T pertaining to the coupled transmit signals 90-1, ..., 90-N travelling from the couplers 50-1, 50-2, ..., 50-N to the switch 100, along the transmit path 400 reaching the calibration update unit 240 and or the digital predistortion update unit 340. Clearly the design of the radio system 1 will allow estimating the portion of the transmit deviations not pertaining to the relaying of the transmit signals 75-1, ..., 75-N being relayed along the transmit paths 70-1, 70-2, ..., 70-N.

Typically, the radio system 1 is connected to a group of two or more antenna elements 60-1, 60-2, ..., 60-N such that a defined phase and amplitude relation between individual ones of the transmit paths 70-1, 70-2, ..., 70-N, can be provided. The defined phase and amplitude relation between the individual ones of the transmit paths 70-1, 70-2, ..., 70-N is required for techniques such as beam forming, beam tilting, a direction of arrival (DoA) detection, as is known in the art. The radio system 1 is adapted to carry out these techniques. The transmit deviations 90T determined by the calibration update module 240 serve as a basis to apply phase and amplitude changes 210-1, 210-2, ..., 210-N to yield the defined phase and amplitude relation between the individual ones of the transmit paths 70-1, 70-2, ..., 70-N.

Figure 10:
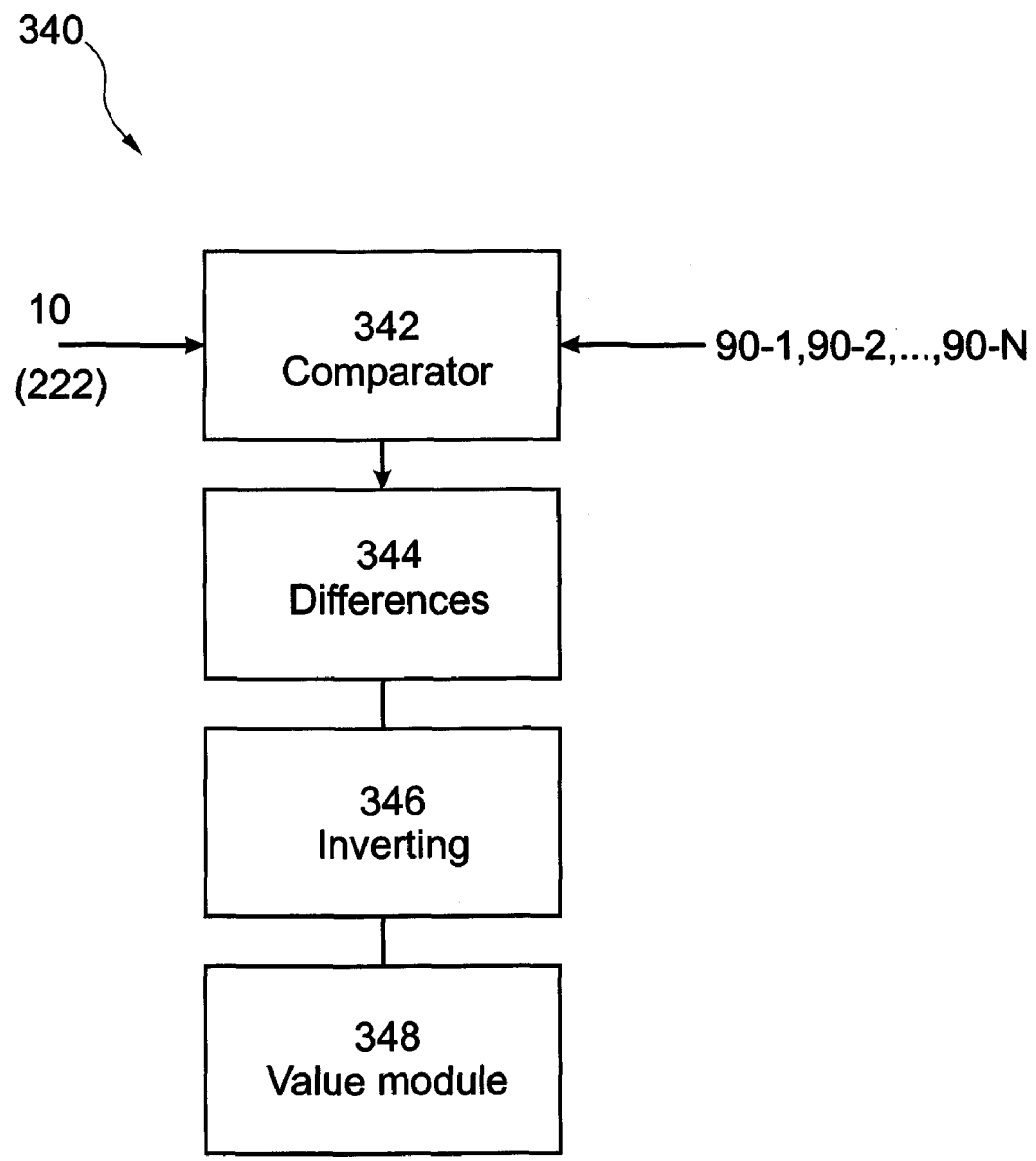
FIG. 10 shows a detailed view of a digital predistortion update module according to the present invention.

FIG. 10 shows the digital predistortion update module 340 for updating the digital predistortions 310-1, 310-2, ..., 310-N applied to the payload signal 10. The digital predistortions 310-1, 310-2, ..., 310-N are typically represented by tables storing polynomial coefficients reflecting non-linearities of the transmit paths 70-1, 70-2, ..., 70-N. Within FIGS. 1-8 there is an individual one of the predistortions 310-1, 310-2, ..., 310-N provided for each one of the transmit paths 70-1, 70-2, ..., 70-N. Nevertheless, it is possible to provide a single one of the digital predistortions 310-1, 310-2, ..., 310-N to more than one of the transmit paths 70-1, 70-2, ..., 70-N. It will be appreciated by a person skilled in the art that providing an individual one of the digital predistortions 310-1, 310-2, ..., 310-N to each one of the transmit paths 70-1, 70-N, enables a more flexible digital predistortion 310-1, 310-2, ..., 310-N to the radio system 1. Therefore providing an individual one of the digital predistortions 310-1, 310-2, ..., 310-N to more than one of the transmit paths 70-1, 70-2, ..., 70-N may reduce system complexity at a trade off in flexibility of the digital predistortion 310-1, 310-2, ..., 310-N.

The concept of digital predistortion is known in the art and will not be explained in much detail here. In any transmit path 70-1, 70-2, ..., 70-N typically the amplifier 40-1, 40-2, ..., 40-N causes non-linearities in the transfer characteristics of the transmit path 70-1, 70-2, ..., 70-N. The concept of digital predistortion provides an "inverted non-linearity" to the payload signal 10 that is to be relayed along the transmit paths 70-1, 70-2, ..., 70-N. This "inverted non-linearity" will correct for the non-linearities accumulated along the transmit paths 70-1, 70-2, ..., 70-N. Therefore, the concept of digital predistortion allows the correcting for the non-linearities introduced by the amplifier 40-1, 40-2, ..., 40-N. Consequently the digital predistortion 310-1, 310-2, ..., 310-N helps to linearise the transfer characteristics of the radio system 1.

FIG. 10 shows the digital predistortion update module 340. The digital predistortion update module 340 updates the coefficients representing the digital predistortions 310-1, 310-2, ..., 310-N. The digital predistortion update module 340 receives the payload signal 10 and the base band feedback signal 90B. Without any limitation it is possible to use a version of the payload signal 10 within an intermediate frequency IF between the base band frequency and the frequency band of transmission of the radio system 1. A comparator 342 compares the payload signal 10 and the base band feedback signal 90B. The payload signal 10 requires at least a portion of non-zero mean value for the updating of the digital predistortions 310-1, 310-2, ..., 310-N as the updating of the digital predistortions 310-1, 310-2, ..., 310-N comprises averaging over several samples of the feedback signal 90B. It surely is a fair assumption to make for the payload signal 10 to comprise portions of non-vanishing mean values when updating the digital predistortions 310-1, 310-2, ..., 310-N.

The comparison between the payload signal 10 and the base band feedback signal 90B may comprise correlating the payload signal 10 and the base band feedback signal 90B, as has already been described with respect to the calibration update module 240 in FIG. 9. As before, it is possible to use a version of the payload signal 10 within an intermediate frequency IF between the base band frequency and the frequency band of transmission of the radio system 1. Typically, the comparator 342 provides differences 344 between the payload signal 10 and the base band feedback signal 90B. The comparator 342 may actually derive differences 344 between the payload signal 10 when entering the radio system 1 and the base band feedback signal 90B, after having traveled the transmit paths 70-1, 70-2, ..., 70-N and the feedback path 400.

The calibrating of phase and amplitude changes 210-1, 210-2, ..., 210-N and the updating of the digital predistortions 310-1, 310-2, ..., 310-N does not interfere with the normal operation of the radio system 1. The differences 344 comprise an amplitude difference over the frequency range of the radio system 1. It is to be understood that the differences in amplitude are represented in the base band when comparing the payload 10 and the base band feedback signal 90B. Again the comparison may without any limitation be carried out at any other intermediate frequency IF. The differences in amplitudes in the base band will represent the amplitude of differences in the frequency band of transmission of the radio station 1. An inverting module 346 inverts the differences 347 provided by the comparator 342. A value module 348 uses an output from the inverting module 346 in order to derive coefficient values that represent the predistortions 310-1, 310-2, ..., 310-N that are applied to the payload signal 10.

The present system further provides a method 800 for relaying radio signals. FIG. 9a shows a flow chart of the method 800.

In a step 810 the payload signal 10 is provided. The payload signal 10 may for example be provided comprising the in-phase component I and the quadrature component Q as pairs (I, Q), as is known in the art. The payload signal 10 may for example be provided at a digital radio interface DRI as explained above.

In a step 830 the digital predistortion 310-1, 310-2, ..., 310-N is applied to the payload signal 10. In a step 840 the phase and amplitude changes 210-1, 210-2, ..., 210-N are applied to the payload signal 10. In a step 850 the payload signal 10 is forwarded along the transmit path 70-1, 70-2, ..., 70-N. A step 860 comprises feeding a selected one of the coupled transmit signals 90-1, 90-2, ..., 90-N back into the feedback path 400. A step 870 comprises an updating of the digital predistortions 310-1, 310-2, ..., 310-N. A step 880 comprises an updating of the phase and amplitude changes 210-1, 210-2, ..., 210-N.

In the step 830 it may be of interest to use predefined values describing the digital predistortion 310-1, 310-2, ..., 310-N when first applying the digital predistortion 310-1, 310-2, ..., 310-N. It may be more reliable to update the phase and amplitude changes 210-1, 210-2, ..., 210-N in the step 880 after the digital predistortions 310-1, 310-2, ..., 310-N are correctly updated in step 870; so that any non-linearity is correctly removed in the step 870 before the amplitude and phase changes 210-1, 210-2, ..., 210-N are updated. This order of the steps 870 and 880 is only of relevance once the digital predistortions 310-1, 310-2, ..., 310-N are drastically out of calibration. If the updating of the phase and amplitude changes 880 was to be carried out before the updating 870 of the digital predistortion 310-1, 310-2, ..., 310-N an extra run of the method 800 may be required in order to correctly calibrate the digital predistortion 310-1, 310-2, ..., 310-N and the phase and amplitude changes 210-1, 210-2, ..., 210-N.

Figure 11A:
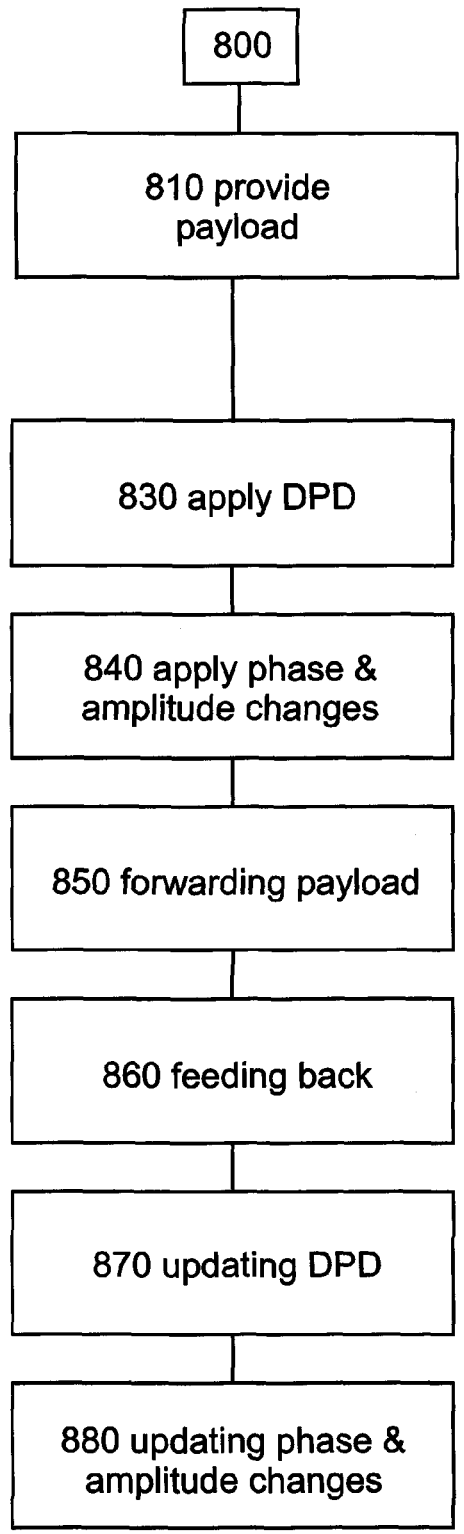
FIG. 11a shows a flow chart of the method for relaying radio signals according to the present invention.
Figure 11B:
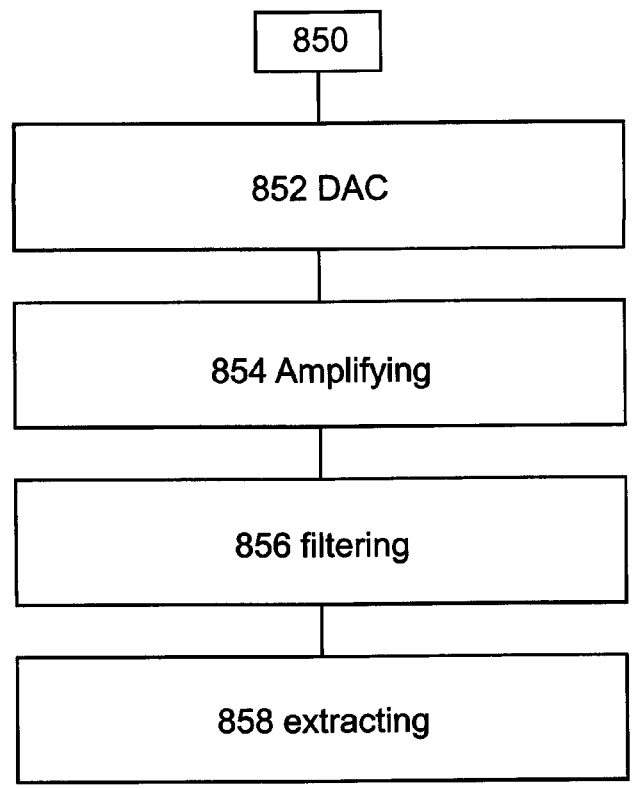
FIG. 11b shows a flow chart illustrating a step of forwarding a payload signal.

FIG. 11b shows further details of the step 850 of forwarding the payload signal 10. The step 850 comprises a step 852 of digital to analogue converting the transmit signal 75-1, 75-2, ..., 75-N. As is known in the art the step of digital to analogue converting may comprise using sigma delta digital to analogue convertors 20-1, 20-2, ..., 20-N. It will be appreciated that the use of the sigma delta digital to analogue convertors does not require an up-converting step and a filtering step as is required with traditional digital to analogue converters.

In a step 854 the transmit signal 75-1, 75-2, ..., 75-N is amplified. The amplifying 854 may be carried out using the amplifier 30-1, 30-2, ..., 30-N. The step 850 furthermore comprises a step of filtering 856 the transmit signal 75-1, 75-2, ..., 75-N. The step of filtering 856 may also well comprise using duplex filters 40-1, 40-2, ..., 40-N. The use of the duplex filter is of interest when dealing with a transmit and receive radio system 1. A step 858 comprises extracting a coupled transmit signal 90-1, 90-2, ..., 90-N from the transmit signals 75-1, 75-2, ..., 75-N.

Figure 11C:
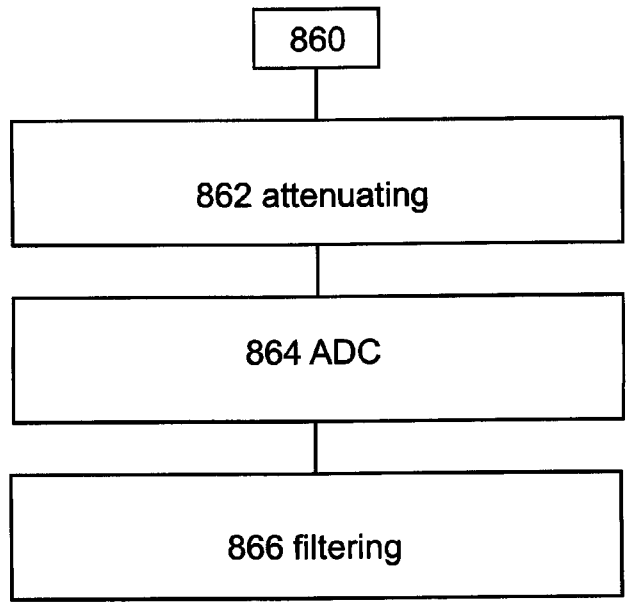
FIG. 11c shows a flow chart illustrating a step of feeding a selected one of coupled transmit signals back.

FIG. 11c shows further details of the step 860 of feeding back the selected one of the coupled transmit signals 90-1, 90-2, ..., 90-N as the feedback signal 90F. The step 860 comprises a step 862 of attenuating the feedback signal 90F. The step of attenuating 862 may be carried out using the attenuator 110 as shows in FIGS. 1-8.

The step 860 comprises a step 864 of analogue to digital converting the feedback signal 90F yielding the base band feedback signal 90B. The step of analogue to digital converting 864 may comprise using sigma delta analogue to digital convertors 120. It is of course possible to use conventional analogue to digital convertors 120 together with down converters 125-1, 125-2, ..., 125-N, as noted earlier in the disclosure. The step 860 further comprises a step 866 of filtering the feedback signal 90F or the base band feedback signal 90B. The step 866 of the filtering of the feedback signal 90F, may comprise using the filters 190-1, 190-2, ..., 190-N, as shown in FIG. 2. The filters 190-1, 190-2, ..., 190-N may be in the form of bandpass filters. Several other types of filters are known to the person skilled in the art. Alternatively, it may be of interest to use the filter 190 (as shown in FIG. 3) downstream of the switch 100. It may well be that the filter characteristics of the filter 190 need to comprise all the filtering characteristics of the filters 190-1, 190-2, ..., 190-N as shown in FIG. 2.

Figure 11D:
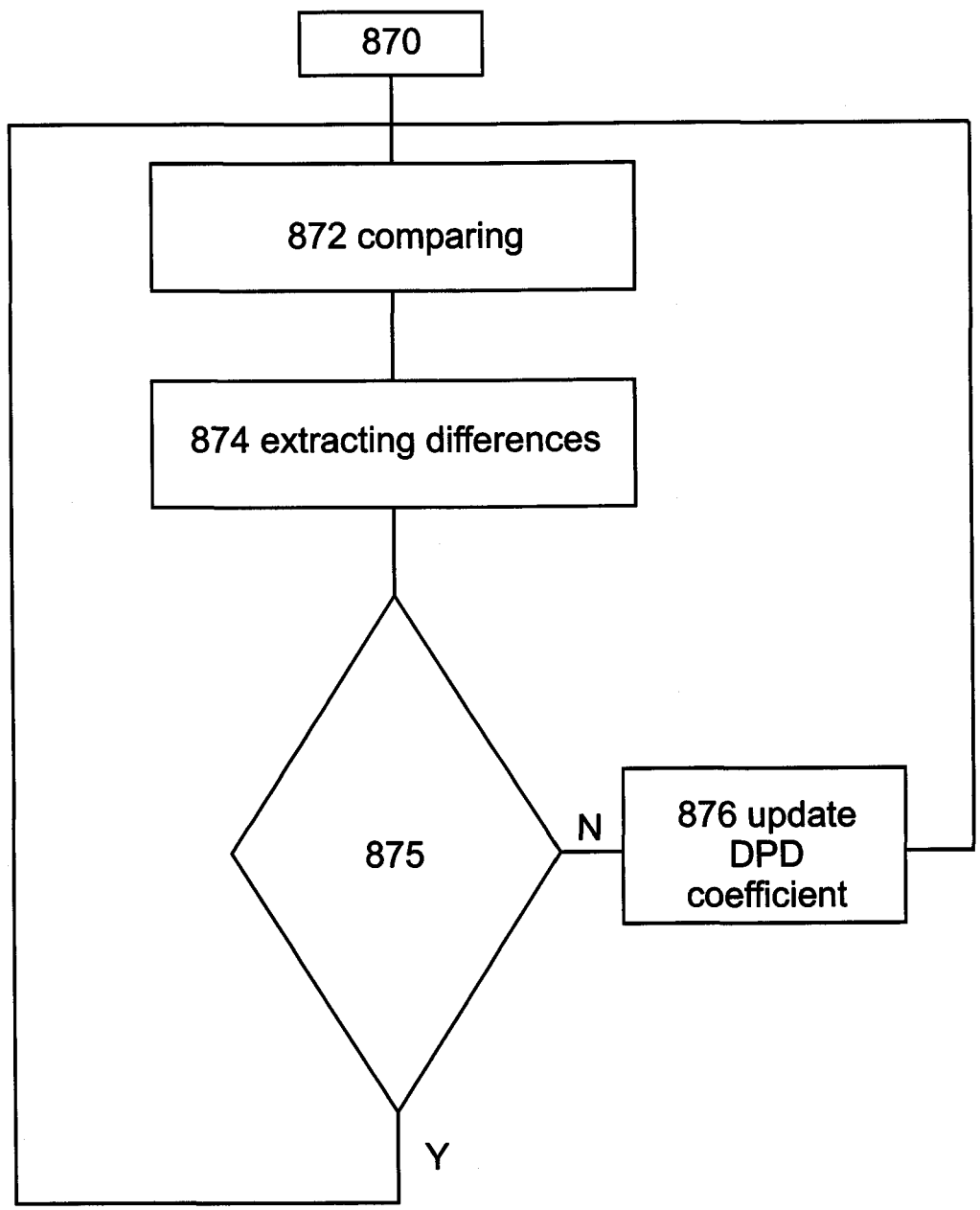
FIG. 11d shows a flow chart illustrating a step of updating the digital predistortion.

FIG. 11d shows the step 870 of the updating of the digital predistortion 310-1, 310-2, ..., 310-N in more detail. The step 870 comprises a step of comparing the base band feedback signal 90B to the payload signal 10. The step of comparing 872 may further comprise a correlating of the payload signal 10 with the base band feedback signal 90B. The step 872 of comparing may further comprise an averaging over several samples of the payload signal 10 and/or the base band feedback signal 90B.

In a step 874 the differences 344 between the payload signal 10 and the base band feedback signal 90B are extracted. The differences 344 form the basis for the digital predistortions 310-1, 310-2, ..., 310-N, in order to linearise the transfer characteristics of the transmit paths 70-1, 70-2, ..., 70-N. In a step 875 it is checked, whether or not the differences 344 extracted in the step 874 are below a predefined threshold. In case the differences 344 are below the predefined threshold, no update of the digital predistortions 310-1, 310-2, ..., 310-N is required. If on the other hand the differences 344 extracted in the step 874 are above the predefined threshold, a step 876 of updating the digital predistortion 310-1, 310-2, ..., 310-N is carried out. The step 876 of updating the digital predistortion 310-1, 310-2, ..., 310-N, provides a new set of coefficients, describing a correction needed in order to lift all non-linearities of the transfer characteristics of the transmit paths 70-1, 70-2, ..., 70-N. Methods to derive an inversion of the differences 344 are known in the art.

After the step 876 the method returns just to the step 872 of comparing.

Figure 11E:
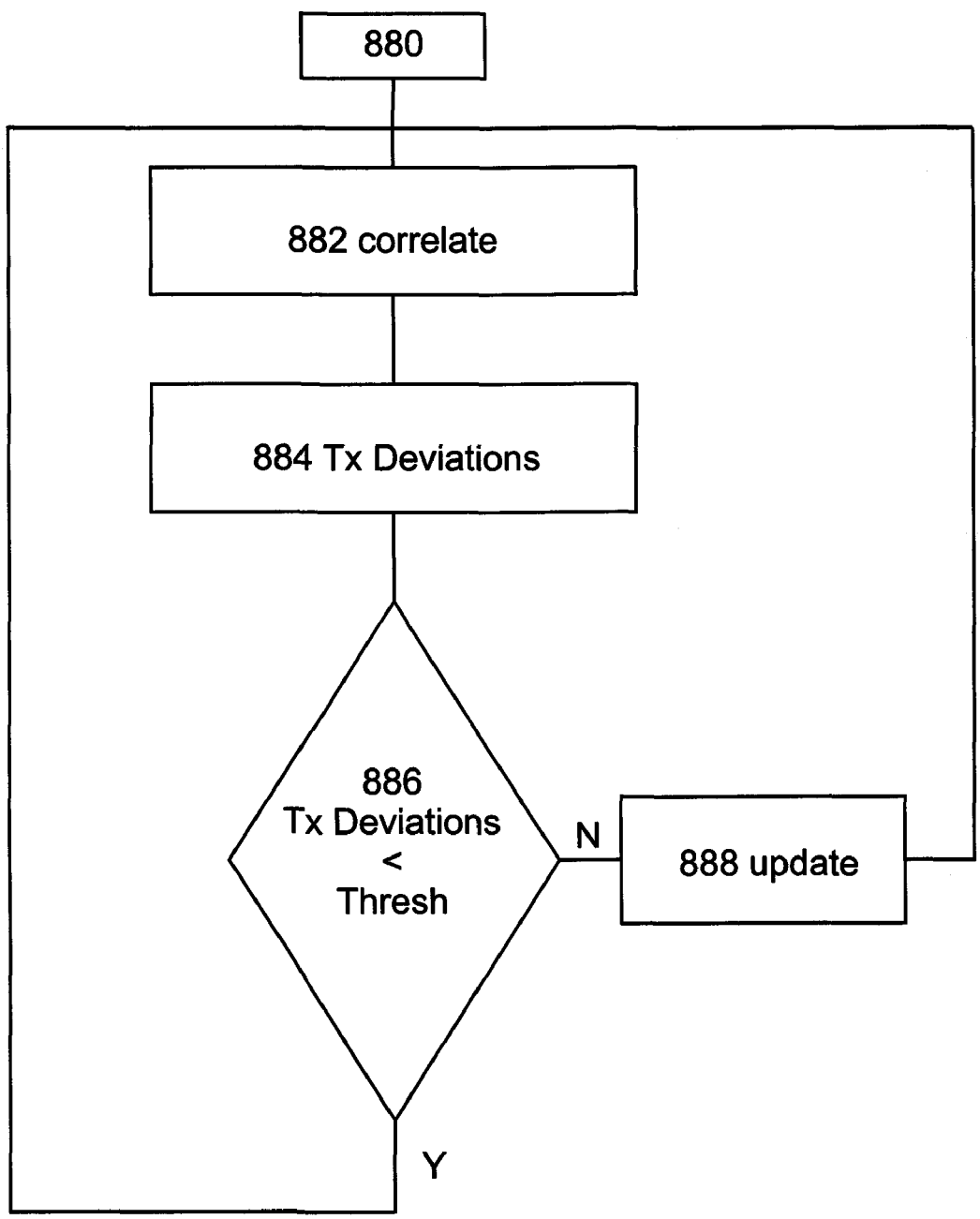
FIG. 11e shows a flow chart illustrating a step of updating the phase and amplitude changes.

FIG. 11e shows details of the step 880 of updating the phase and amplitude changes 210-1, 210-2, ..., 210-N. A step 882 comprises correlating the payload signal 10 and the base band feedback signal 90B. In a step 884 transmit deviations 90T are derived form the signals correlated in the step 882. It is to be understood that the transmit deviations 90T may comprise transit times needed for the payload signal 10 entering the DRI until a corresponding transmit signal 75-1, ..., 75-N is being relayed by the radio system 1. In a step 886 it is checked if the transmit deviations 90T are below a predefined threshold. In case the transmit deviations 90T are below the predefined threshold the method 800 returns to the step 882. In case the transmit deviations 90T are not below the predefined threshold in a step 888 an updating of the phase and amplitude changes 210-1, 210-2, ..., 210-N is carried out, responsive to the transmit deviations 90T derived in the step 886. The updating 888 of the phase and amplitude changes 210-1, 210-2, . . . , 210-N is well known in the art and shall not be discussed any further.

It is to be understood that the method 800 has been explained for the calibration of the digital predistortions 310-1, 310-2, . . . , 310-N and the phase and amplitude changes 210-1, 210-2, . . . , 210-N for an individual one of the transmit paths 70-1, 70-2 . . . , 70-N within FIGS. 11a-11e. Only for the aspect of the radio system 1 as shown in FIG. 6 all the transmit paths 70-1, 70-2, . . . , 70-N will be calibrated after a first iteration of the method 800 as described. For all other aspects of the radio system 1 several iterations of the method 800 as described will be required for all the transmit paths 70-1, 70-2, . . . , 70-N to be calibrated.

While various aspects of the present invention have been described above, it should be understood that they have been presented by way of example, and not limitation. It will be apparent to persons skilled in the relevant arts that various changes in form and detail can be made therein without departing from the scope of the invention. For example, any bipolar transistors depicted in the drawings and/or described in the text could be field effect transistors, and vice versa. The resonators need not be a LC-type resonator, but also any other type of suitable resonator, such as a tank or a surface wave resonator. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the present invention may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A radio system for relaying radio signals, the radio system comprising:
at least one transmit path adapted to forward a payload signal as a transmit signal,
at least one amplifier adapted to amplify the transmit signal,
at least one duplex filter adapted to separate the transmit signal as a relayed transmit signal from a receive signal,
a digital predistortion unit adapted to apply a digital predistortion to the payload signal for linearising a transfer characteristic of the radio system,
a calibration unit adapted to apply phase and amplitude changes to the at least one transmit path,
at least one coupler to extract coupled transmit signals extracted from the transmit signal,
a feedback path commonly used by the digital predistortion unit and the calibration unit for feeding back a selected one of the coupled transmit signals as a feedback signal,
at least one switch located in close proximity to an output of the at least one amplifier, the at least one switch being configured to switch between the coupled transmit signals and the relayed transmit signal relayed by the at least one duplex filter, thereby forwarding a selected one of the coupled transmit signals and the relayed transmit signal,
a multi-way switch located at a distance from the at least one transmit path, the multi-way switch being adapted to select said selected one of the coupled transmit signals and the relayed transmit signal as a feedback signal, wherein at least one of: the phase and amplitude changes and the digital predistortion is adaptable using the feedback signal.

2. The radio system according to claim 1, wherein at least one of the phase and amplitude changes and the digital predistortions is adaptable using correlations of the payload signal and the feedback signal.

3. The radio system according to claim 1, wherein the feedback signal is concurrently used to update the phase and amplitude changes and to update the digital predistortions.

4. The radio system according to claim 1, further comprising a calibration update module for updating the phase and amplitude changes.

5. The radio system according to claim 1, further comprising a digital predistortion update module for updating the digital predistortion.

6. The radio system according to claim 1, wherein the at least one transmit path is terminated by an antenna element.

7. The radio system according to claim 1, wherein the at least one transmit path further comprises a digital to analogue converter.

8. The radio system according to claim 7, wherein the digital to analogue converter comprises a sigma delta digital to analogue converter.

9. The radio system according to claim 1, wherein the at least one transmit path further comprises an amplifier for amplifying the transmit signal.

10. The radio system according to claim 1, wherein the at least one transmit path further comprises a filter filtering the transmit signal.

11. The radio system according to claim 10, wherein the filter comprises a duplex filter.

12. The radio system according to claim 1, wherein the at least one transmit path further comprises a coupler for extracting the coupled transmit signals out of the transmit signal.

13. The radio system according to claim 1, further comprising a switch for forwarding the selected one of the coupled transmit signals as the feedback signal.

14. The radio system according to claim 1, wherein the feedback path further comprises an attenuator.

15. The radio system according to claim 1, wherein the feedback path further comprises an analogue to digital converter.

16. The radio system according to claim 15, wherein the analogue to digital converter comprises a sigma delta converter.

17. The radio system according to claim 1, wherein the transmit path further comprises an up-converter unit for up-converting the transmit signal.

18. The radio system according to claim 17, the up-converting unit further comprising a filtering element for filtering the transmit signal.

19. The radio system according to claim 1, wherein the feedback path further comprises a down-converter unit for down-converting the selected one of the coupled transmit signals.

20. The radio system according to claim 1, further comprising a splitter adapted to extract a portion from the coupled transmit signals.

21. The radio system according to claim 1, further comprising a power detector.

22. The radio system according to claim 21, wherein at least one of the following elements is implemented on a chip: the calibration unit, the predistortion unit, a calibration update module, a digital predistortion update module, a digital to analogue converter, an analogue digital converter and the power detector.

23. The radio system according to claim 22, wherein the chip comprises a digital signal processor (DSP).

24. A method for relaying radio signals, the method comprising:
providing a payload signal,
applying a digital predistortion to the payload signal,
applying phase and amplitude changes to at least one transmit path,
forwarding the payload signal as a transmit signal along the at least one transmit path,
extracting coupled transmit signals extracted from the transmit signal,
separating the transmit signal as a relayed transmit signal from a receive signal,
switching between the coupled transmit signals and the relayed transmit signal, thereby forwarding a selected one of the coupled transmit signals and the relayed transmit signal,
a multi-way switch located at a distance from the at least one transmit path, the multi-way switch being adapted to select said selected one of the coupled transmit signals and the relayed transmit signal as a feedback signal,
feeding back said selected one of coupled transmit signals as a feedback signal,
updating the digital predistortion in response to the feedback signal, and
updating the phase and amplitude changes in response to the feedback signal.

25. The method according to claim 24, wherein at least one of the updating of the digital predistortions and the updating the phase and amplitude changes comprises using correlation methods.

26. The method according to claim 24, wherein the forwarding of the payload signal as a transmit signal along the at least one transmit path further comprises:
digital to analogue converting the transmit signal,
amplifying the transmit signal,
filtering the transmit signal,
extracting a coupled transmit signal from the at least one transmit path.

27. The method according to claim 24, wherein the feeding back of the selected one of the coupled transmit signals as the feedback signal comprises:
attenuating at least one of the coupled transmit signals and the feedback signal,
analogue to digital converting the feedback signal yielding a base band feedback signal.

28. The method according to claim 24, wherein the feeding back of the selected one of the coupled transmit signals as the feedback signal comprises:
filtering the feedback signal.

29. The method according to claim 24, wherein the updating of the digital predistortion comprises:
comparing the payload signal and the base band feedback signal,
extracting differences between the payload signal and the base band feedback signal,
checking if the differences are below a threshold, and
updating the digital predistortion responsive to the checking.

30. The method according to claim 24, wherein the updating of the phase and amplitude changes comprises:
correlating the payload and the base band feedback signal,
extracting transmit deviations,
checking whether the transmit deviations are above a threshold, and
updating the phase and amplitude changes responsive to the checking.

31. Computer program product embodied on a non-transitory computer-readable medium and the computer-readable medium comprising executable instructions for the manufacture of the radio system according to claim 1.

32. Computer program product embodied on a non-transitory computer-readable medium and the computer-readable medium comprising executable instructions for the execution of the method for relaying radio signals according to claim 24.

* * * * *